United States Patent
Miyamoto

(10) Patent No.: US 7,459,883 B2
(45) Date of Patent: *Dec. 2, 2008

(54) APPARATUS FOR MONITORING THE VOLTAGE OF A BATTERY PACK HAVING A PLURALITY OF BATTERY CELLS CONNECTED IN SERIES

(75) Inventor: Manabu Miyamoto, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 16 days.

This patent is subject to a terminal disclaimer.

(21) Appl. No.: 11/601,636

(22) Filed: Nov. 20, 2006

(65) Prior Publication Data

US 2007/0114973 A1 May 24, 2007

(30) Foreign Application Priority Data

Nov. 21, 2005 (JP) .............................. 2005-336206

(51) Int. Cl.
*H01M 10/46* (2006.01)

(52) U.S. Cl. ..................................... 320/116
(58) Field of Classification Search ................ 320/116, 320/117, 118, 120, 134, 136

See application file for complete search history.

(56) References Cited

U.S. PATENT DOCUMENTS

2007/0188149 A1* 8/2007 Miyamoto .................. 320/134

FOREIGN PATENT DOCUMENTS

| JP | 2003-111284 | 4/2003 |
|---|---|---|
| JP | 2003-208927 | 7/2003 |
| JP | 2005-117780 | 4/2005 |

* cited by examiner

*Primary Examiner*—Edward Tso
(74) *Attorney, Agent, or Firm*—Young & Thompson

(57) ABSTRACT

A battery voltage monitoring apparatus according to the present invention for monitoring a voltage of a battery pack having a plurality of battery cells connected in series includes a first terminal connected supplied with a highest battery voltage of the battery cell, and a voltage clamp circuit for clamping a voltage of the first terminal not to decrease below a specified value.

13 Claims, 5 Drawing Sheets

APPARATUS FOR MONITORING THE VOLTAGE OF A BATTERY PACK HAVING A PLURALITY OF BATTERY CELLS CONNECTED IN SERIES

BACKGROUND OF THE INVENTION

1. Field of the Invention

The present invention relates to a battery voltage monitoring apparatus for detecting a battery voltage of a power supply device having a plurality of secondary batteries connected in series, and particularly to a battery voltage monitoring apparatus for detecting a disconnection of a signal line for measuring a voltage.

2. Description of the Related Art

Conventionally an electric and hybrid vehicles are known as an environmentally friendly vehicle. A motor is used for a drive source of the electric and hybrid vehicles. A rechargeable secondary battery is connected with the motor. A direct current obtained from the secondary battery is converted into an alternating current by an inverter to drive the motor. Since the secondary battery requires a high voltage, it is usually formed as a battery pack having a plurality of battery cells connected in series.

A plurality of voltage sensors are used to detect voltages of each battery cell in the battery pack. The voltage sensors are divided into an appropriate number to be modularized. A plurality of the voltage sensor modules are prepared and connected in series in case many battery cells to be connected in series are required for the electric vehicles, for example. An apparatus for monitoring a voltage of such a battery pack is disclosed in Japanese Unexamined Patent Application Publication No. 2003-208927, Japanese Unexamined Patent Application Publication No. 2003-111284 and Japanese Unexamined Patent Application Publication No. 2005-117780. An apparatus for monitoring a voltage of the battery pack including a plurality of integrated circuits (ICs) are explained hereinafter in detail. The modules having the plurality of voltage sensors are formed by one integrated circuit.

FIG. 5 is a schematic view showing a conventional voltage monitoring apparatus. As shown in FIG. 5, one IC is capable of detecting voltages of four battery cells. Each input terminal of the IC is connected to battery cells C11 to C18 through lines for measuring voltage L11 to L19. The IC11 of FIG. 5 operates with a positive electrode side of the battery cell C11 (node N11) as a power supply potential, and a negative electrode side of the battery cell C14 (a positive electrode side of the battery cell C15, node N12) as a ground potential. The IC detects an overvoltage or undervoltage condition of the battery cell it is monitoring and outputs an overvoltage or undervoltage detection signal. A disconnection of a highest line supplying power to an IC such as the line L11 in an apparatus including the plurality of ICs connected in series for monitoring the voltage of the battery pack could cause the following problem.

A disconnection of the line L11 of FIG. 5 stops a power supply to a node N13, thus a voltage of the node N13 decreases. As a result, parasitic transistors in the integrated circuit are turned on, causing a latch up.

It has now been discovered that the integrated circuit forming the voltage monitoring apparatus could be broken down by heat caused by the latch up as a result of the disconnection of the line.

SUMMARY OF THE INVENTION

According to an aspect of the present invention, there is provided a battery voltage monitoring apparatus for monitoring a voltage of a battery pack having a plurality of battery cells connected in series, the battery voltage monitoring apparatus including a voltage sensor and a voltage sensor module having a first and a second input terminals connected to the voltage sensor, a first terminal connected with the first input terminal and supplied with a voltage output from a highest battery cell located at a top of the plurality of battery cells connected in series, a second terminal connected with the second input terminal and supplied with a voltage output from a battery cell located at a second top following the highest battery cell, and a voltage clamp circuit for clamping a voltage between the first and the second terminals not to be over a specified value.

According to another aspect of the present invention, there is provided a battery voltage monitoring apparatus for monitoring a voltage of a battery pack having a plurality of battery cells connected in series, the battery voltage monitoring apparatus including a first terminal supplied with a highest voltage of the battery pack, and a voltage clamp circuit for maintaining a voltage of the first terminal not to decrease below a specified voltage.

It is possible to prevent from a latch up in an event of a disconnection of a line supplying a voltage.

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
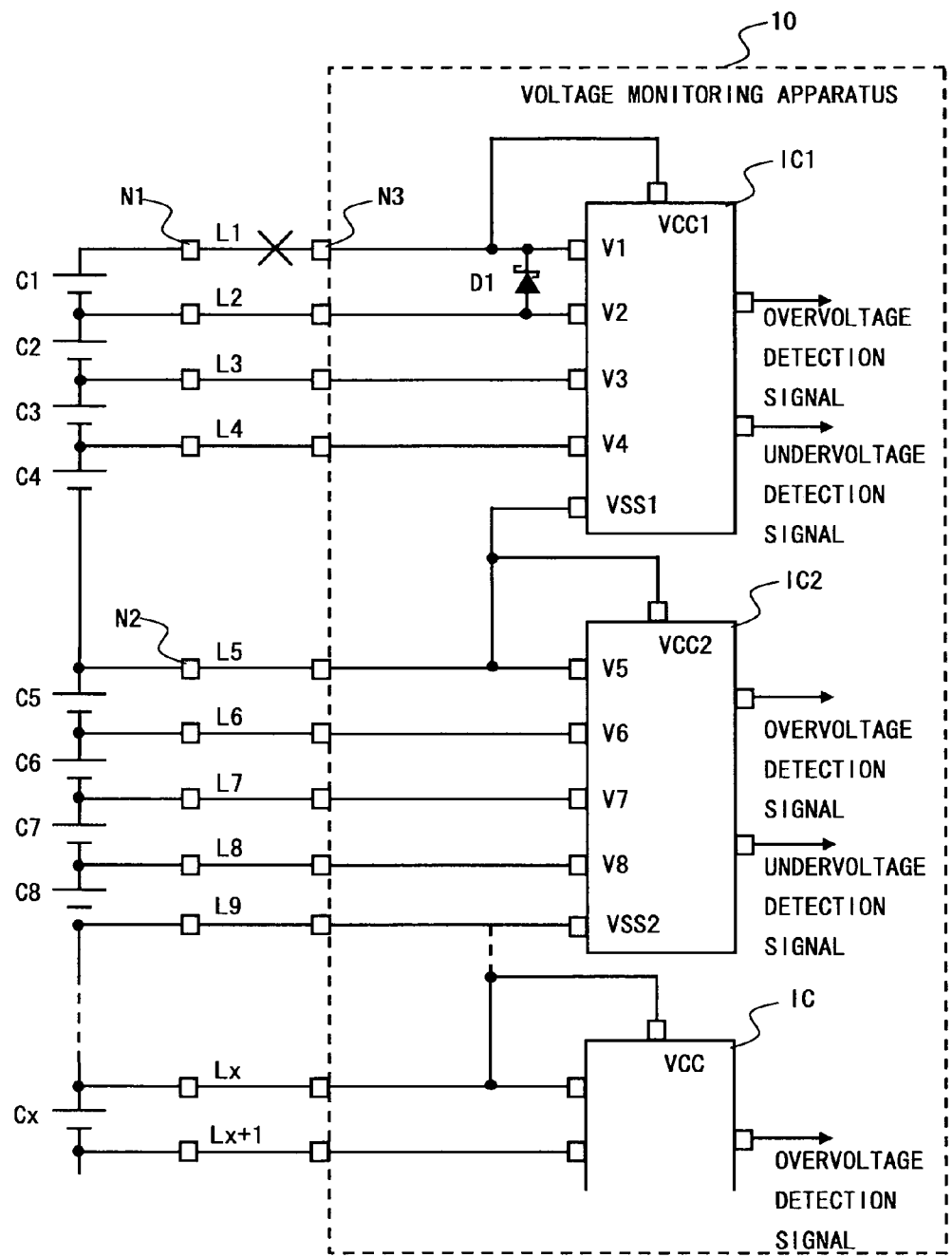
FIG. 1 is a circuit view showing a voltage monitoring apparatus according to a first embodiment of the present invention.

A first embodiment of the present invention is described hereinafter in detail with reference to the drawings. FIG. 1 is a schematic view explaining a voltage monitoring apparatus of the first embodiment. The voltage monitoring apparatus 10 of this embodiment includes a plurality of voltage sensor modules. The voltage module sensor is a device formed by one or a plurality of voltage sensors being modularized. In this embodiment, one module is formed by one integrated circuit (hereinafter referred to as IC). The first embodiment is described hereinafter with an example in which one IC detects voltages of four battery cells. An example of one IC detecting voltages of four battery cells is explained hereinafter in detail.

As shown in FIG. 1 in this embodiment, a plurality of battery cells C1 to Cn that the voltage monitoring apparatus 10 monitors are connected in series. The IC1 and the battery cells connected to the IC1 supplied with a highest potential are described especially in detail hereinafter. The IC1 operates with a positive electrode potential of the battery cell C1 (see node N1 of FIG. 1) as a first power supply potential, and a positive electrode potential of the battery cell C4 (see node N2 of FIG. 1) as a second power supply potential (i.e. ground potential).

The positive electrode of each battery cell is respectively connected with input terminals V1 to V4 through lines L1 to L4. As described in the foregoing, since the IC1 have the positive electrode potential of the battery cell C1 as the first power supply potential, the positive electrode of the battery cell C1 is also connected to a first power supply terminal VCC1 of the IC1 through the line L1. Further, since the positive electrode potential of the battery cell C5 is also connected to a second power supply terminal VSS1 of the IC1 through a line L5.

In the first embodiment, a Schottky diode D1, a device for controlling a voltage, is connected between the input terminals V1 and V2 of the IC1. An anode of the Schottky diode D1 is connected to the V2 terminal, and a cathode of D1 is connected to the V1 terminal.

In the voltage monitoring apparatus 10 configured as above, the voltage sensor module measures a voltage output from each battery cell. The voltage sensor module monitors the voltage of the battery cell by outputting an overvoltage detection signal or an undervoltage detection signal in case the voltage of the battery cell becomes overvoltage or undervoltage. A detailed operation is described later in detail.

A case in which the line L1 (the highest potential line)) for supplying a power supply potential to the IC1 is disconnected for some reason in the voltage monitoring apparatus configured as above is described hereinafter in detail. With the disconnection of the line L1, the positive electrode potential of the battery cell C1 (the highest potential, see node N1) is not supplied. Thus a potential of a node N3 of FIG. 1 decreases. The decrease of the potential of the node N3 causes a potential of the input terminal V2 to be higher than a potential of the input terminal V1. In such a case, a parasitic transistor inside may be turned on at a point in which the difference between the potentials of the input terminals V1 and V2 increases beyond a certain value. In this embodiment, by connecting the forward diode D1 from the input terminals V2 to V1, the input terminal V1 does not decrease below the voltage for the forward voltage of the Schottky diode against the input terminal V2. Thus the parasitic transistor is not turned on.

Figure 2:
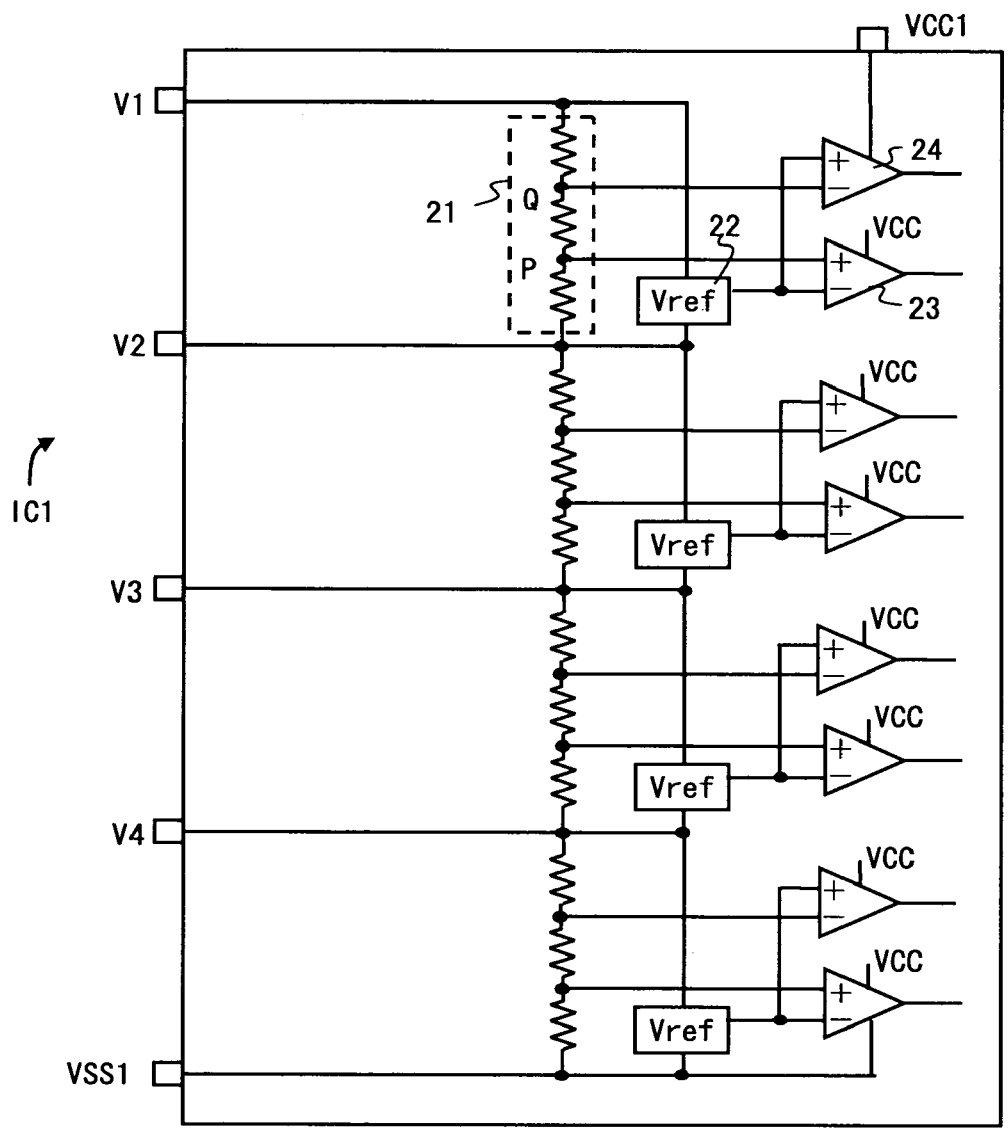
FIG. 2 is a circuit view showing a voltage sensor module of the voltage monitoring apparatus according to the first embodiment of the present invention.

An operation and an effect of this embodiment are described hereinafter in detail. Firstly a configuration of an IC (voltage sensor module) in the voltage monitoring apparatus of the first embodiment is described hereinafter in detail. FIG. 2 is a view showing the configuration of the IC.

As shown in FIG. 2, the IC in this embodiment is connected with voltage sensors between the terminals. A configuration of the voltage sensor is described hereinafter in detail, with an example of the voltage sensor between the voltage input terminals V1 and V2 of FIG. 2. As shown in FIG. 2, the voltage sensor of the first embodiment includes a voltage dividing resistor 21, a reference voltage generation circuit 22, an overvoltage detection comparator 23, and an undervoltage detection comparator 24. A first voltage dividing point P of the voltage dividing resistor is connected with a non-inverted input terminal of the overvoltage detection comparator 23. A second voltage dividing point Q of the voltage dividing resistor is connected with an inverted input terminal of the undervoltage detection comparator 24. A voltage output from the reference voltage generating circuit 22 is connected with an inverted input terminal of the overvoltage detection comparator 23 and a non-inverted input terminal of the undervoltage detection comparator 24.

In the voltage sensor, a voltage of the voltage dividing point P of the voltage dividing resistor for detecting voltage is compared with the reference voltage Vref in the overvoltage detection comparator 23. In case the voltage of the voltage dividing point P of the voltage dividing resistor for detecting voltage is higher than the reference voltage Vref, the overvoltage detection comparator 23 outputs the overvoltage detection signal (for example H level signal). Similarly, a voltage of the voltage dividing point Q of the voltage dividing resistor for detecting voltage is compared with the reference voltage Vref in the undervoltage detection comparator 23. In case the voltage of the voltage dividing point Q is lower than the reference voltage, the undervoltage detection signal (for example H level signal) is output.

Figure 3:
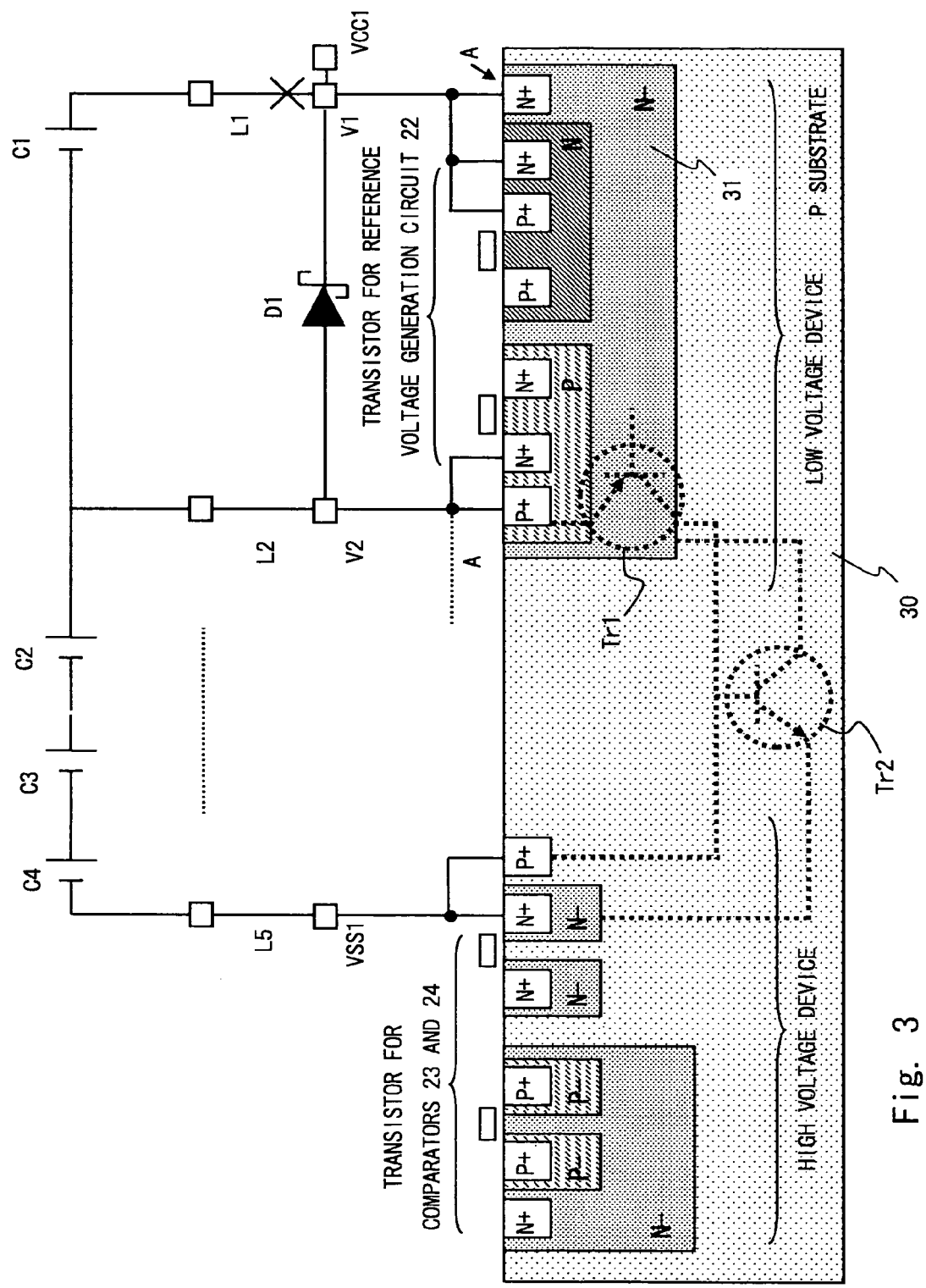
FIG. 3 is a schematic view showing a semiconductor apparatus according to the first embodiment of the present invention.

In this embodiment, the reference voltage generation circuit 22 is a circuit operating with a voltage output from one battery cell (for example a voltage between V1 and V2) as a power supply voltage. The overvoltage and undervoltage detection comparators 23 and 24 operate with a power supply voltage of IC (for example a voltage between VCC1 and VSS1) as a power supply. FIG. 3 is a cross-sectional view schematically showing an IC in which circuits using different voltages as power supply voltages are formed to a same substrate.

As shown in FIG. 3, a PMOS and a NMOS transistors forming the reference voltage generating circuit 22 between the V1 and the V2 are formed in an N⁻well 31 having a potential of the terminal V1 as a well potential. A stable potential is supplied to the N⁻well 31 through a diffusion layer indicated by A in FIG. 3 in case there is no disconnection in the line L1. Thus the integrated circuit operates normally with the positive electrode potential of C1 as an upper side power supply and the negative electrode potential of C1 as a lower side power supply being supplied thereto.

Without the Schottky diode from the terminals V2 to V1 in FIG. 1 and with a disconnection of the line L1, a potential of a well 31 decreases, the well 31 having the reference voltage generation circuit formed thereto. A large decrease of the potential causes the P well forming the NMOS transistor and a parasitic bipolar transistor (indicated with Tr1 in FIG. 3) formed by the N⁻well 31 and a P type substrate 30 to be turned on. Turning on the parasitic transistor Tr1 turns on a parasitic transistor Tr2 of FIG. 3, thereby further reducing a base potential of the parasitic transistor Tr1. Consequently a large current is generated between the input terminal V2 and the substrate forming the integrated circuit (supplied with VSS1 for the IC1) and the integrated circuit could be broken.

However in this embodiment, a forward Schottky D1 is connected from the input terminals V1 to V2. In a normal operation, the V1 has a higher potential than the V2 as long as the line L1 is not disconnected. Thus the diode has no influence. However with the disconnection in the line L1 that causes the potential of the input terminal V1 to be lower than that of the input terminal V2, a forward voltage is applied to the diode. Accordingly assuming the forward voltage of the diode D1 to be Vf, the potential of the input terminal V1, which is a potential of the N well 31, will not decrease lower than (the potential of V2−Vf). Thus a potential decrease of the N⁻ well 31, in which the reference voltage generation circuit 22 between the terminals V1 and V2 is formed, can be suppressed. By specifying the forward voltage of the diode Vf to an appropriate value, the potential decrease of the N⁻ well 31 can be restricted before the parasitic bipolar transistor Tr1 of FIG. 3 is turned on. That is, in this embodiment, even if the line, which supplies the highest power supply potential to the battery voltage monitoring apparatus, is disconnected, the potential of the terminal V1 does not decrease for the specified value from the highest power supply potential. Providing the diode D1 enables to prevent from a latch up and the like in an integrated circuit.

Second Embodiment

Figure 4:
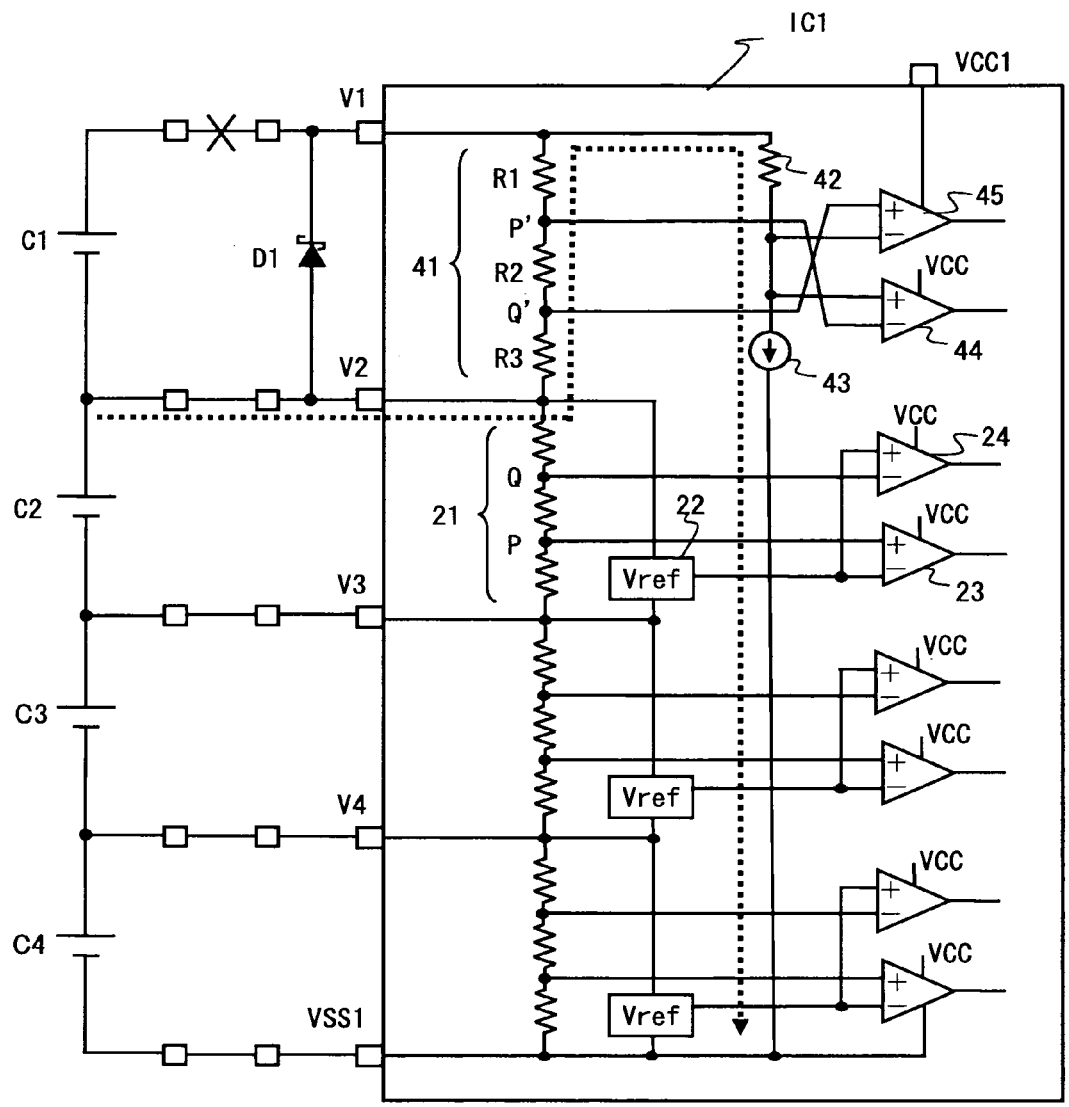
FIG. 4 is a circuit view showing a voltage monitoring apparatus according to a second embodiment of the present invention.
Figure 5:
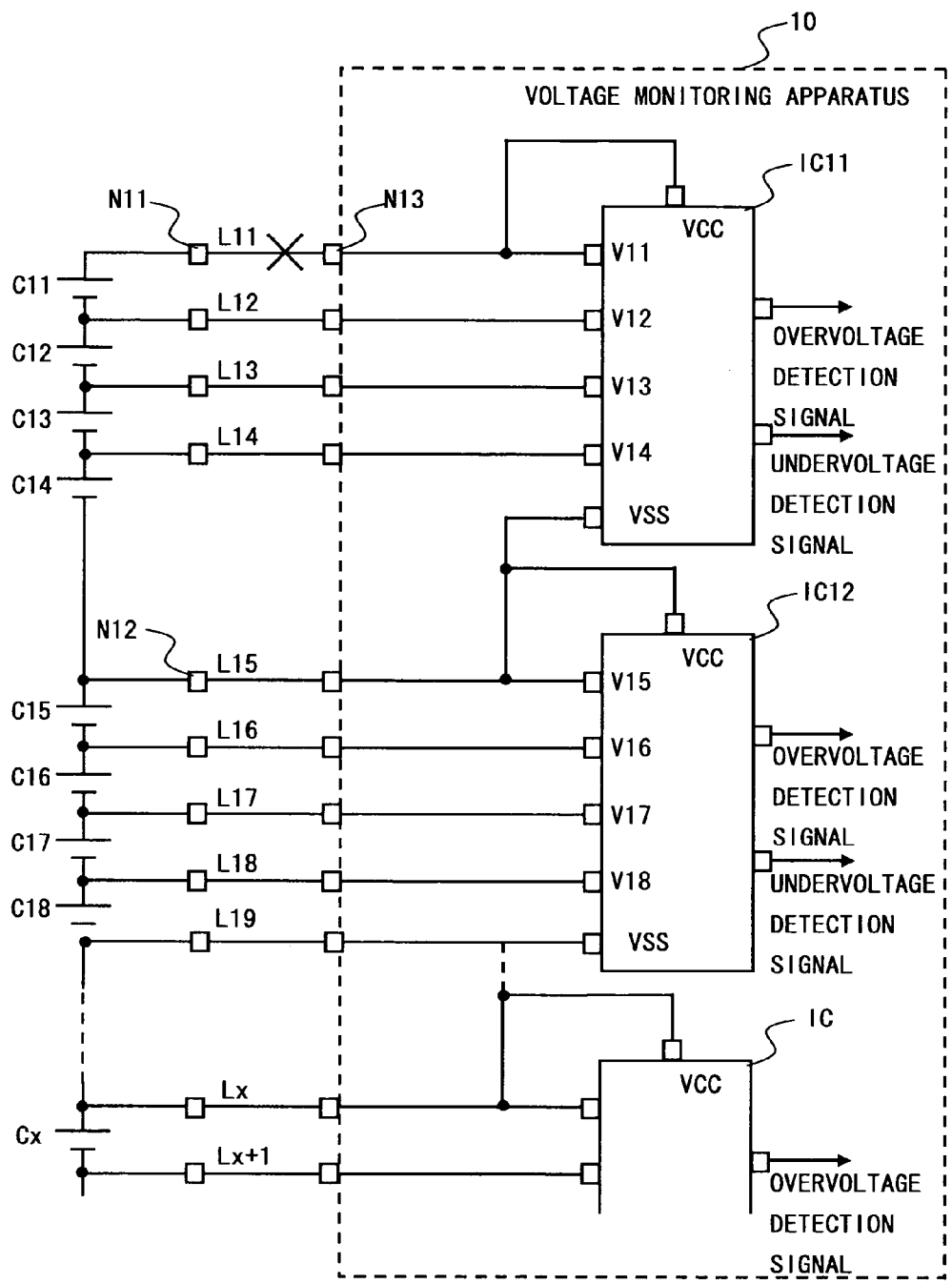
FIG. 5 is a circuit view showing a voltage monitoring apparatus according to a conventional apparatus.

FIG. 4 is a circuit view showing a voltage monitoring apparatus according to a second embodiment of the present invention. As explained in the first embodiment in which the diode D1 is provided between the terminal V1 supplied with the highest voltage and the terminal V2, it is possible to prevent from breaking IC due to the latch up caused by the disconnection. However by forming the IC, a voltage sensor module, using the circuit shown in FIG. 2 for example, the reference voltage generation circuit 22 between the V1 and the V2 becomes inoperative in an event of a disconnection in the line L1 of FIG. 1, because the potential of the terminal V1 of FIG. 2 becomes lower than that of the V2. Thus the disconnection in the line L1 cannot be detected.

Therefore in this embodiment, a configuration of the voltage sensor connected to the terminal supplied with the highest potential is modified to be able to detect the disconnection even in the event of the disconnection of the line L1.

The second embodiment is described hereinafter with an example of a circuit in which the terminal V1 supplied with the most significant potential of the voltage monitoring apparatus and the terminal V2 are connected thereto. The same voltage sensor as the one explained with FIG. 2 is provided to terminals other than the terminal supplied with the highest potential (for example between the V2 and the V3, and the V3 and the V4). Thus the explanation will not be repeated here. Further, a forward diode is connected from the V2 to V1 as with the first embodiment.

As shown in FIG. 4, the voltage sensor between the input terminals V1 and V2 includes a voltage dividing resistor 41, a reference resistance 42 for generating a reference voltage, and a constant current source 43. It further includes an overvoltage detection comparator 44 and an undervoltage detection comparator 45. The voltage dividing resistor 41 has three resistances R1 to R3 connected in series between the input terminals V1 and V2, for example. A voltage dividing point P' is assumed to be a node between R1 and R2. A voltage dividing point Q' for detecting an undervoltage is assumed to be a node between R2 and R3. The reference resistance 42 and the constant current source 43 are connected in series between the input terminal V1 and the VSS1, a ground potential for IC.

The voltage dividing point P' is connected to an inverted input terminal of the overvoltage detection comparator 44. The voltage dividing point Q' of the voltage dividing resistor is connected to a non-inverted input terminal of the undervoltage detection comparator 45. A potential between the reference resistance 42 and the constant current source is connected to a non-inverted input terminal of the overvoltage detection comparator 44.

A case in which there is no disconnection in the line L1 in a normal operation is described hereinafter in detail. The overvoltage detection comparator 44 in the voltage sensor between the V1 and the V2 compares a voltage of the voltage dividing point P' of the voltage dividing resistor 41 with a value of voltage decrease in the positive voltage of the highest cell C1 according to the reference resistance 42 and the constant current source 43. Assuming a resistance value of the reference resistance 42 to be Rref and a current that the constant current source 43 passes to be Iref, the overvoltage detection signal is output when:

Voltage of P'<(Positive electrode voltage of the highest battery cell C1−Iref·Rref)

For the undervoltage detection circuit, a voltage of the Q' is compared with a value of voltage decrease in the positive voltage of the highest cell C1 according to the reference resistance 42 and the constant current source 43. The undervoltage detection signal is output when:

Voltage of Q'>(Positive electrode voltage of the highest battery cell C1−Iref·Rref)

With the disconnection of the line L1, a current supply from the highest battery cell C1 to the reference resistance 42 and the constant current source 43 is suspended, thereby a current is supplied in a path indicated with dotted line in FIG. 4. In this case, the voltage of Q' is input to the non-inverted input terminal of the undervoltage detection comparator 45. The voltage of the voltage dividing point Q' at this time is:

Voltage of Q'=(Positive voltage of the battery cell C2)−R3·Iref

A voltage supplied to the inverted input terminal of the undervoltage detection comparator is:

Inverted input of undervoltage detection comparator=(Positive electrode potential of the battery cell C2)−(R1+R2+R3+Rref)·Iref)

Accordingly in the second embodiment, the voltage sensor between the V1 and V2 definitely outputs the undervoltage detection signal at the disconnection of L1. By this configuration, the disconnection of the line L1 supplying the highest potential can certainly be detected with the second embodiment. Further, by the forward diode from the terminals V2 to V1 being connected as with the first embodiment, a latch up in IC can be prevented.

It is apparent that the present invention is not limited to the above embodiment, that may be modified and changed without departing from the scope and spirit of the invention.

What is claimed is:

1. A battery voltage monitoring apparatus for monitoring a voltage of a battery pack having a plurality of battery cells connected in series, the battery voltage monitoring apparatus comprising:
   a voltage sensor and a voltage sensor module having a first and a second input terminals connected to the voltage sensor;
   a first terminal connected with the first input terminal and supplied with a voltage output from a highest battery cell located at a top of the plurality of battery cells connected in series;
   a second terminal connected with the second input terminal and supplied with a voltage output from a battery cell located at a second top following the highest battery cell; and a voltage clamp circuit for clamping a voltage between the first and the second terminals not to be over a specified value.

2. The battery voltage monitoring apparatus according to claim 1, wherein the voltage clamp circuit is a voltage clamp device connected between the first and the second terminals.

3. The battery voltage monitoring apparatus according to claim 2, wherein the voltage clamp device is a diode connected in forward direction from the second terminal to the first terminal.

4. The battery monitoring apparatus according to claim 1, further comprising:
   a first resistance with its one end connected to the first terminal;
   a comparator for comparing a voltage of another end of the first resistance with a reference voltage generated according to a voltage of the first terminal;
   wherein the battery voltage monitoring apparatus determines whether or not a disconnection of a line exists according to a result of the comparison.

5. The battery voltage monitoring apparatus according to claim 2, further comprising:
   a first resistance with its one end connected to the first terminal;
   a comparator for comparing a voltage of another end of the first resistance with a reference voltage generated according to a voltage of the first terminal;
   wherein the battery voltage monitoring apparatus determines whether or not a disconnection of a line exists according to a result of the comparison.

6. The battery voltage monitoring apparatus according to claim 4, wherein the reference voltage is generated from a second resistance with its one end connected to the first terminal.

7. The battery voltage monitoring apparatus according to claim 4, wherein the reference voltage is generated by the second resistance with its one end connected to the first terminal and a current source connected to the second resistance.

8. A battery voltage monitoring apparatus for monitoring a voltage of a battery pack having a plurality of battery cells connected in series, the battery voltage monitoring apparatus comprising:
   a first terminal supplied with a highest voltage of the battery pack; and
   a voltage clamp circuit for maintaining a voltage of the first terminal not to decrease below a specified voltage.

9. The battery voltage monitoring apparatus according to claim 8, wherein the voltage clamp circuit is a voltage clamp device connected between the first terminal and a second terminal different from the first terminal.

10. The battery voltage monitoring apparatus according to claim 9, wherein the voltage clamp device is a diode connected in forward direction from the second terminal to the first terminal.

11. The battery voltage monitoring apparatus according to claim 8, further comprising:
   a first resistance with its one end connected to the first terminal;
   a comparator for comparing a voltage of another end of the first resistance with a reference voltage generated according to a voltage of the first terminal;
   wherein the battery voltage monitoring apparatus determines whether or not a disconnection of a line exists according to a result of the comparison.

12. The battery voltage monitoring apparatus according to claim 11, wherein the reference voltage is generated from a second resistance with its one end connected to the first terminal.

13. The battery voltage monitoring apparatus according to claim 11, wherein the reference voltage is generated by the second resistance with its one end connected to the first terminal and a current source connected to the second resistance.

* * * * *